(12) United States Patent
Yu

(10) Patent No.: US 6,506,650 B1
(45) Date of Patent: Jan. 14, 2003

(54) METHOD OF FABRICATION BASED ON SOLID-PHASE EPITAXY FOR A MOSFET TRANSISTOR WITH A CONTROLLED DOPANT PROFILE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/843,782

(22) Filed: Apr. 27, 2001

(51) Int. Cl.[7] .............................................. H01L 21/336
(52) U.S. Cl. ..................... 438/301; 438/303; 438/305; 438/595
(58) Field of Search ................................ 438/231, 230, 438/595, 649, 651, 655, 682, 305, 528, 592, 301

(56) References Cited

U.S. PATENT DOCUMENTS

| | | | | |
|---|---|---|---|---|
| 4,784,965 A | * | 11/1988 | Woo et al. ...................... | 437/30 |
| 4,784,971 A | * | 11/1988 | Chiu et al. ..................... | 437/57 |
| 4,818,714 A | * | 4/1989 | Haskell ......................... | 437/44 |
| 5,153,145 A | * | 10/1992 | Lee et al. ...................... | 437/44 |
| 5,679,589 A | * | 10/1997 | Lee et al. ...................... | 437/40 |
| 5,714,413 A | * | 2/1998 | Bringham et al. ........... | 438/301 |
| 5,783,475 A | * | 7/1998 | Ramaswami ................ | 438/303 |
| 5,920,783 A | * | 7/1999 | Tseng et al. ................. | 438/305 |
| 5,976,939 A | * | 11/1999 | Thompson et al. ......... | 438/231 |
| 6,013,569 A | * | 1/2000 | Lur et al. ..................... | 438/595 |
| 6,015,741 A | * | 1/2000 | Lin et al. ..................... | 438/305 |
| 6,136,636 A | * | 10/2000 | Wu ............................. | 438/231 |
| 6,153,483 A | * | 11/2000 | Yeh et al. .................... | 438/299 |
| 6,165,826 A | * | 12/2000 | Chau et al. ................. | 438/231 |
| 6,265,274 B1 | * | 7/2001 | Huang et al. ............... | 438/305 |
| 6,277,683 B1 | * | 8/2001 | Pradeep et al. ............. | 438/200 |

* cited by examiner

Primary Examiner—John F. Niebling
Assistant Examiner—Angel Roman
(74) Attorney, Agent, or Firm—LaRiviere, Grubman & Payne, LLP

(57) ABSTRACT

A MOSFET transistor and method of fabrication are described for engineering the channel dopant profile within a MOSFET transistor utilizing a single deep implantation step and solid-phase epitaxy. The method utilizes the formation of an L-shaped spacer having reduced height "cutouts" adjacent to the gate stack. The L-shaped spacer is preferably created by depositing two layers of insulating material, over which a third spacer is formed as a mask for removing unwanted portions of the first and second insulation layers. Amorphization and deep implantation is performed through the L-shaped spacer, wherein the junction contour is profiled in response to the geometry of the L-shaped spacer, such that a single deep implantation step may be utilized. Pocketed steps within the contoured junction reduce short-channel effects while allowing the formation of silicide to a depth which exceeds the junction depth implanted beneath the gate electrode.

16 Claims, 7 Drawing Sheets

METHOD OF FABRICATION BASED ON SOLID-PHASE EPITAXY FOR A MOSFET TRANSISTOR WITH A CONTROLLED DOPANT PROFILE

BACKGROUND OF THE INVENTION

1. Field of the Invention

The present invention relates to MOSFET transistor fabrication and more particularly to a MOSFET transistor and fabrication method wherein a junction is extended to follow an engineered contour in response to a selectively shaped spacer.

2. Description of the Background Art

Within conventional fabrication processes, implanted source-drain regions of the MOSFET transistor are extended to increase immunity of a device to short-channel effects including threshold voltage ($V_{th}$) roll-off and drain-induced lowering of barrier voltage. MOSFETs which are fabricated with uniformly doped channels exhibit rapid threshold voltage ($V_{th}$) roll-off with reduced gate length $L_g$. To reduce the short-channel effects as channel depth decreases, processes are being developed for utilizing multiple implantation stages to fabricate a MOSFET transistor with a channel that contains an implanted pocket region. As channel length continues to decrease, these conventional mechanisms are insufficient to stave off short-channel effects. Furthermore, as spacer width is decreased in a scaled device, formation of silicide within a deep source-drain junction may overlap the channel region to create a severe punch-through risk within a subsurface.

Therefore, a need exists for a MOSFET transistor and method of fabrication which reduce short-channel effects. The present invention satisfies that need, as well as others, and overcomes the deficiencies of previously developed solutions.

BRIEF SUMMARY OF THE INVENTION

The present invention describes a MOSFET transistor and associated fabrication method for extending the source-drain regions to follow an engineered profile and to facilitate the formation of a deep silicide layer on the source and drain to reduce the risk of punch-through. The method utilizes the formation of multiple insulation spacers over a gate stack under which a primary implantation has been performed. The two spacers are selectively etched to form an L-shaped spacer adjacent the gate stack with an implantation "cutout" proximal the side of the adjacent gate stack. Implant extensions are performed through the L-shaped spacer which creates a junction profile responsive to the L-shaped spacer and the implantation "cutouts". It will be appreciated that a stepped junction having pocketed steps may be created within a single deep implantation step as performed through the L-shaped spacer. The method is thereby capable of reducing the number of implantations required for a given stepped profile. The pocketed steps create a transition from a deep implantation under the respective source and drain contacts to a narrow implantation beneath the gate electrode. After implantation, solid-phase epitaxy is preferably performed within a low-temperature anneal process to recrystallize the silicon and to activate the implanted dopants. The L-shaped spacer is subsequently utilized after junction formation to insulate the gate from the source and drain regions such that the contact spacing may be minimized.

By way of example the L-shaped spacer is formed according to the following series of steps. Three spacer layers are deposited over substrate, each layer capable of being selectively etched in relation to the other layers. The majority of the third spacer layer is subsequently removed by etching, wherein the only portions of material that remain are located at the base of the gate stack, which is still covered by the first and second spacer layers. The material from the third deposited layer which remains after etching is referred to as a third spacer. A subsequent etching step is performed to remove portions of the first and second spacer that are not protected by the third spacer. After shaping the first and second spacer layers, the third spacer and a vertical portion of the first spacer are removed. Implantation through the contoured L-shaped spacer results in the formation of a junction having a desired profile. The contoured L-shaped spacer insulates the gate from the source and drain. The contour of the junction provides a deep implantation under the source and drain regions which are capable of supporting a thick silicide layer. The remainder of the MOSFET transistor may be formed utilizing conventional fabrication steps.

An object of the invention is to provide a convenient method for engineering the junction contour within a MOSFET transistor.

Another object of the invention is to engineer a stepped junction contour without the use of additional implantation steps.

Another object of the invention is to provide a MOSFET transistor having a short contact spacing to enhance circuit density.

Another object of the invention is to facilitate source-drain silicide formation to a depth that can exceed the depth of the implanted junction depth below the gate stack.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally illustrated in FIG. 1 through FIG. 7. It will be appreciated that the apparatus may vary as to configuration and as to details of the parts, and that the method may vary as to the specific steps and sequence, without departing from the basic concepts as disclosed herein.

Figure 1:
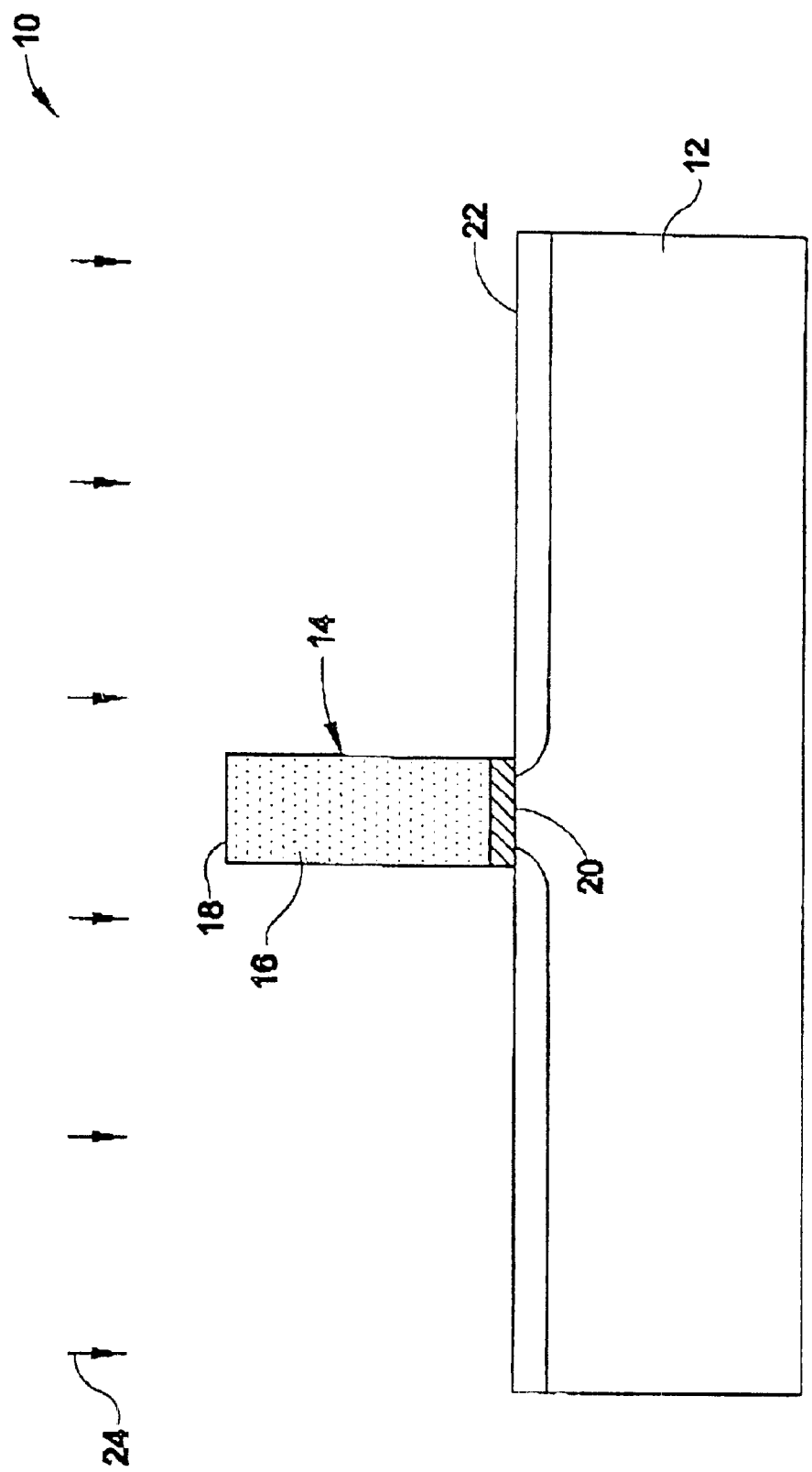
FIG. 1 is a schematic view of MOSFET transistor formation according to an aspect of the present invention, shown after formation of a gate stack during a preamorphization implant phase.

The processing of a MOSFET device 10 according to the present invention is embodied in the schematic sequence shown in FIG. 1 through FIG. 7. Referring first to FIG. 1, MOSFET device 10 is fabricated on a substrate 12 following the formation of a gate stack 14 comprising an electrode 16, having a top surface 18, formed over a gate insulator 20 in contact with substrate 12. A source-drain implant junction 22 is created by performing a shallow preamorphization implant 24, which preferably implants either Ge, Si, Xe, or similar dopants, and provides source-drain extension. The resultant amorphous layer thickness is equal to the depth of the junction 22 after recrystallization or solid-phase epitaxy is performed. Junction 22 is preferably ten nanometers to twenty five nanometers (10 nm–25 nm) in depth.

Figure 2:
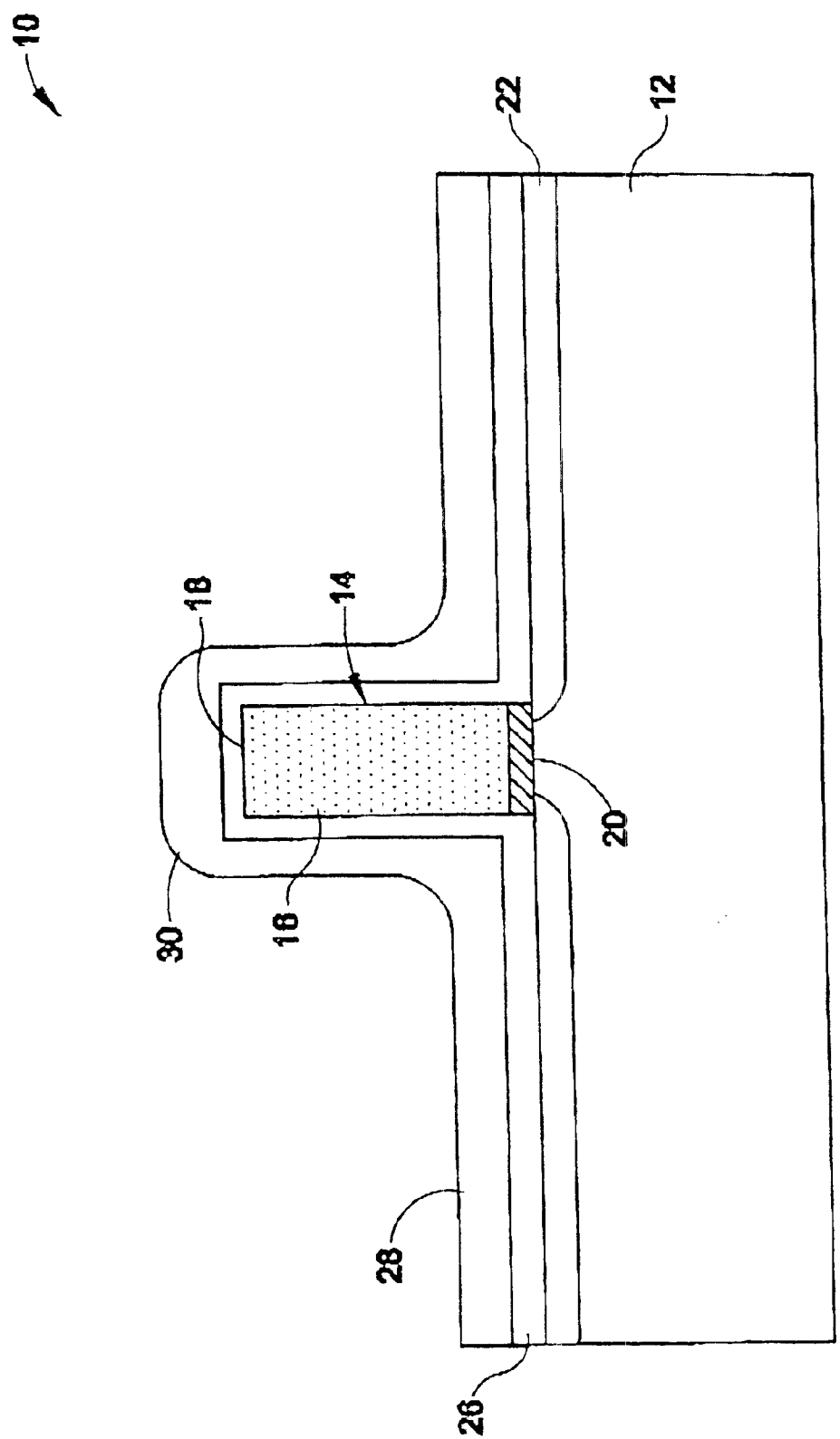
FIG. 2 is a schematic view of the MOSFET of FIG. 1, shown subsequent to deposition of a liner oxide as a first spacer and a nitride layer as a second spacer.
Figure 3:
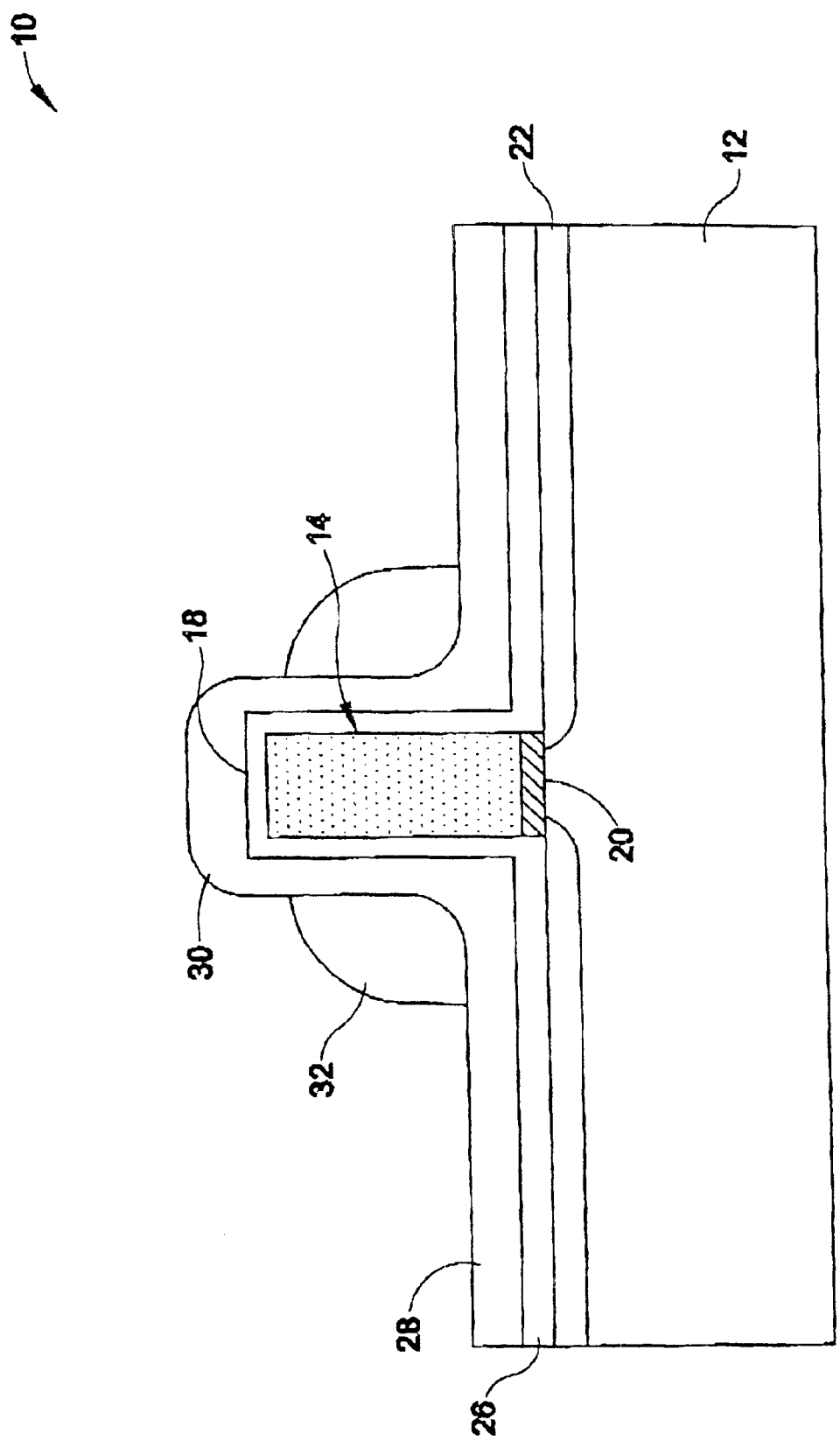
FIG. 3 is a schematic view of the MOSFET of FIG. 2, shown after formation of a thick oxide material as a third spacer at the base of the gate stack.
Figure 4:
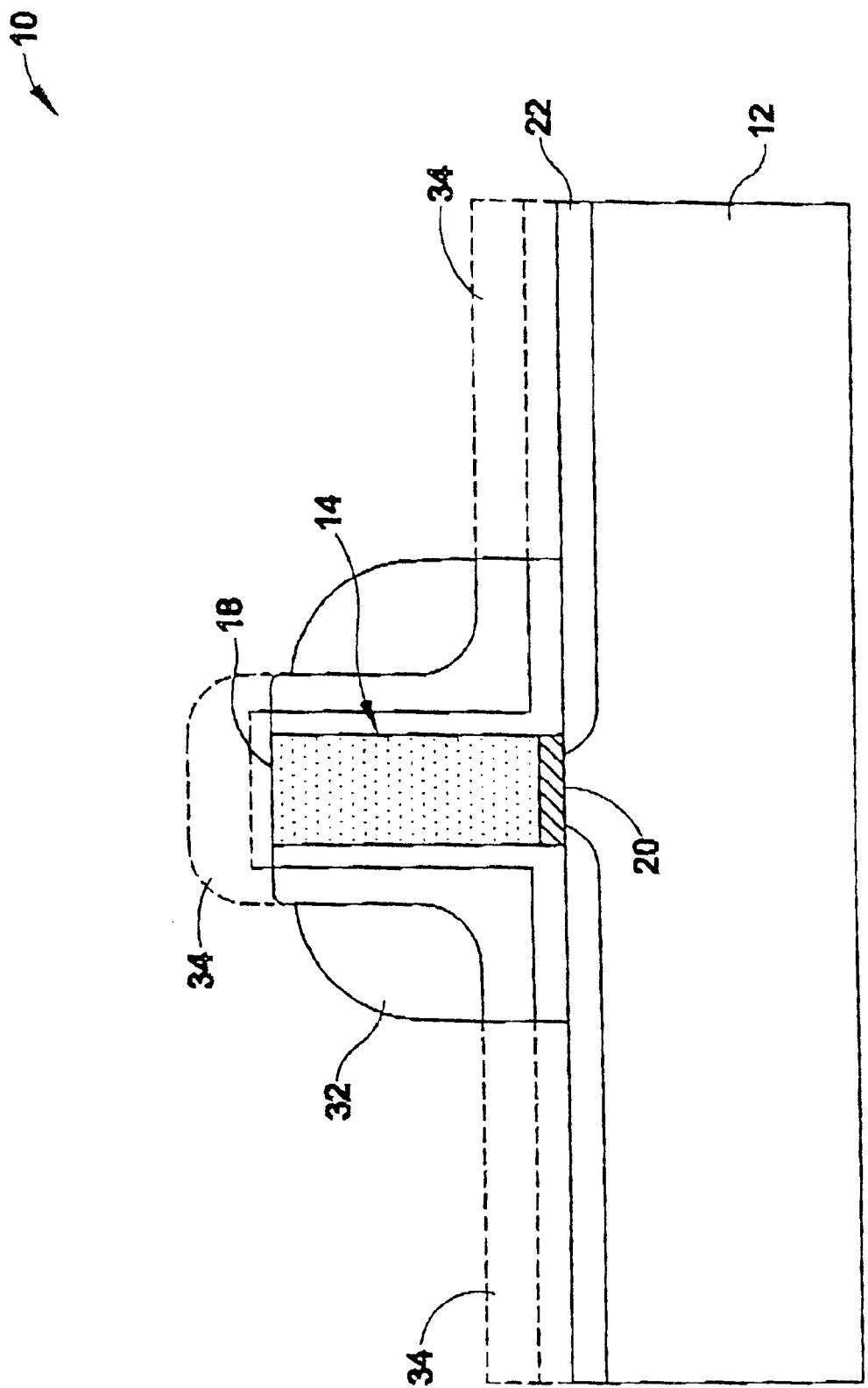
FIG. 4 is a schematic view of the MOSFET of FIG. 3, shown after removal of unprotected regions of the first and second spacer.

A first spacer 26 and a second spacer 28 are deposited to arrive at the structure shown in FIG. 2. First spacer 26 preferably comprises a thin liner oxide 26 (gate oxide) layer between one hundred Angstroms and two hundred Angstroms (100Å–200Å) in depth. A second spacer 28 is deposited over the first spacer 26 and both layers provide a covering 30 over gate stack 14. The insulating material of second spacer 28 is chosen to allow selective etching in relation to the material of first spacer 26. Preferably, second spacer 28 comprises a nitride layer deposited to a depth of between two hundred fifty and four hundred Angstroms (250Å–400Å). Another layer of insulation is deposited and etched to create a third spacer 32, adjacent to gate stack 14, as depicted in FIG. 3. A thick oxide layer having a thickness between approximately five hundred Angstroms and one thousand Angstroms (500Å–1000Å) is preferably deposited over substrate 12 and selectively etched to form third spacer 32, having a width of between approximately twenty nanometers to forty nanometers (20 nm–40 nm). Referring now to FIG. 4, "unprotected" areas 34 of first spacer 26 and second spacer 28, being unprotected by third spacer 32, are selectively etched away. It will be appreciated that the gate stack covering 30 has also been etched away to expose the top of gate stack 14.

Figure 5:
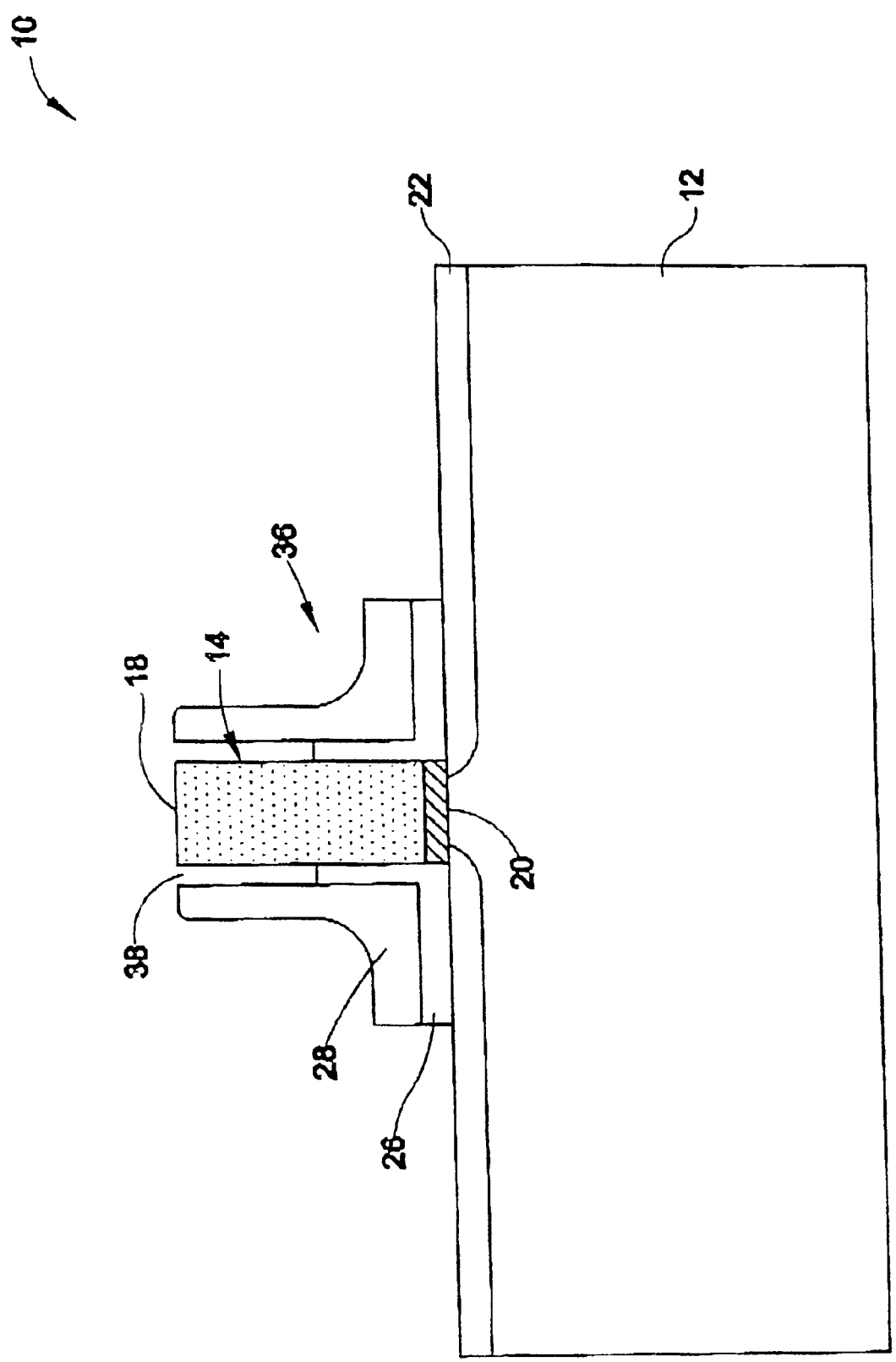
FIG. 5 is a schematic view of the MOSFET of FIG. 4, shown after removal of the third spacer.
Figure 6:
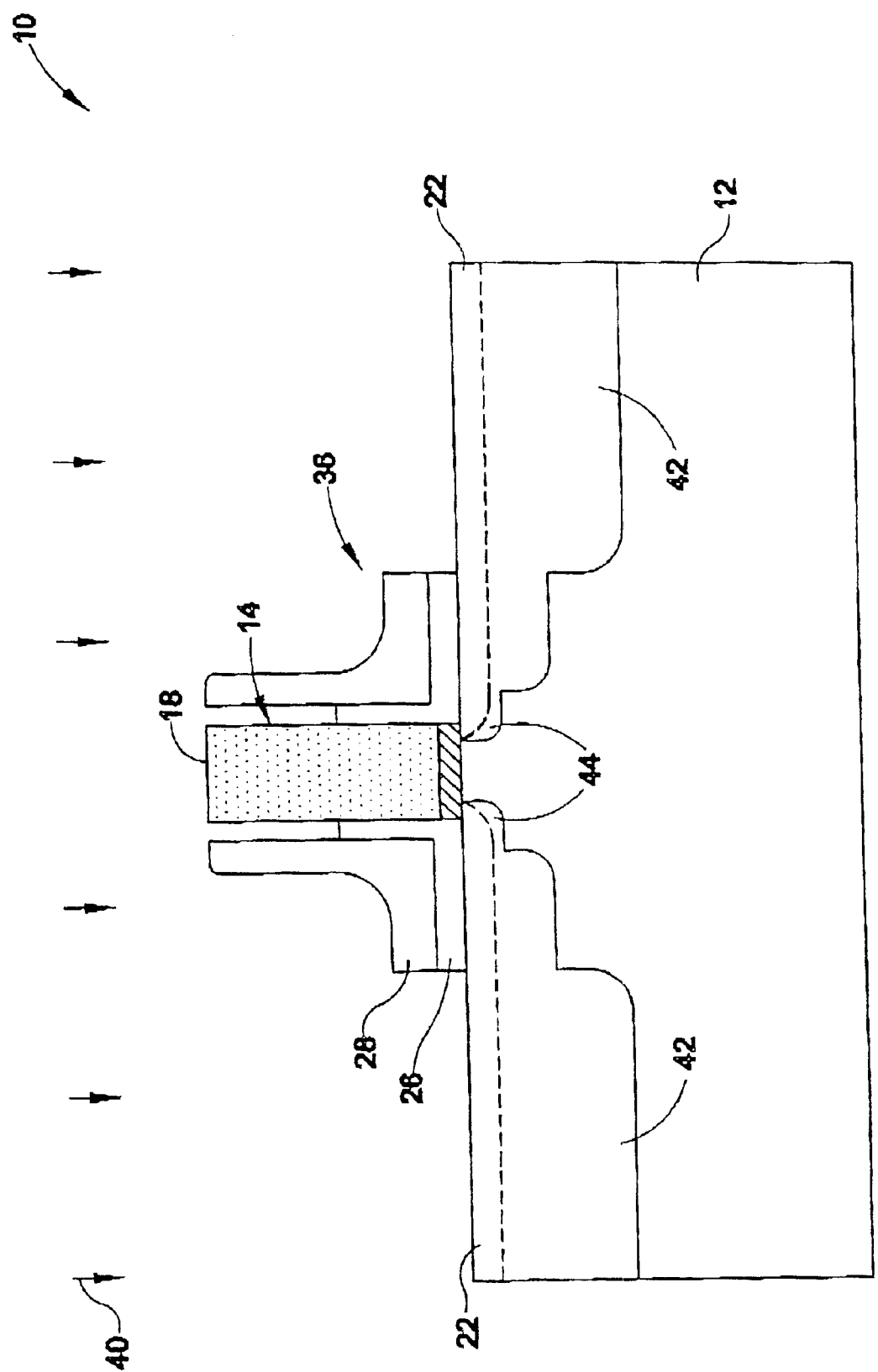
FIG. 6 is a schematic view of the MOSFET of FIG. 5, shown during deep amorphization and dopant implanting to create buffered extensions.

Third spacer 32 is subsequently removed, in addition to a portion of first spacer 26 adjacent to the gate stack as shown in FIG. 5, to create an implantation "cutout" which contours L-shaped spacer 36 comprising remaining portions of first spacer 26 and second spacer 28. Removal of third spacer 32 may be performed according to any of a number of processes, such as by a time-controlled wet etching. An amorphization implant and deep source-drain implantation 40 is shown in FIG. 6 being performed through L-shaped spacer 36. Deep implantation 40 is performed utilizing species such as Ge, Si, Xe, and so forth, wherein implantation depth is controlled by the geometry of the L-shaped spacer, including implantation "cutouts" 38. As a result, an amorphous silicon layer (a-Si) is formed which is shallower than that of the deep a-Si layer, but deeper than the formed a-Si layer of the source-drain extension. Therefore as a result of the effect of performing dopant implantation through the L-shaped spacer, the depth of dopant implantation is shifted in accord with the thickness of the L-shaped spacer to reduce implantation depth and create a buffer layer. The resultant buffered source-drain extensions 42, and buffered junction extensions 44, have engineered contours that are responsive to the geometry of L-shaped spacer 36. The engineered contours preferably comprise pocketed steps that provide a transition from a deep implantation beneath the source and drain contact regions to a shallow implantation beneath the gate electrode. The deep implantation in the source and drain contact regions allow the formation of a deep layer of silicide while maintaining a shallow source to drain junction beneath the gate.

Figure 7:
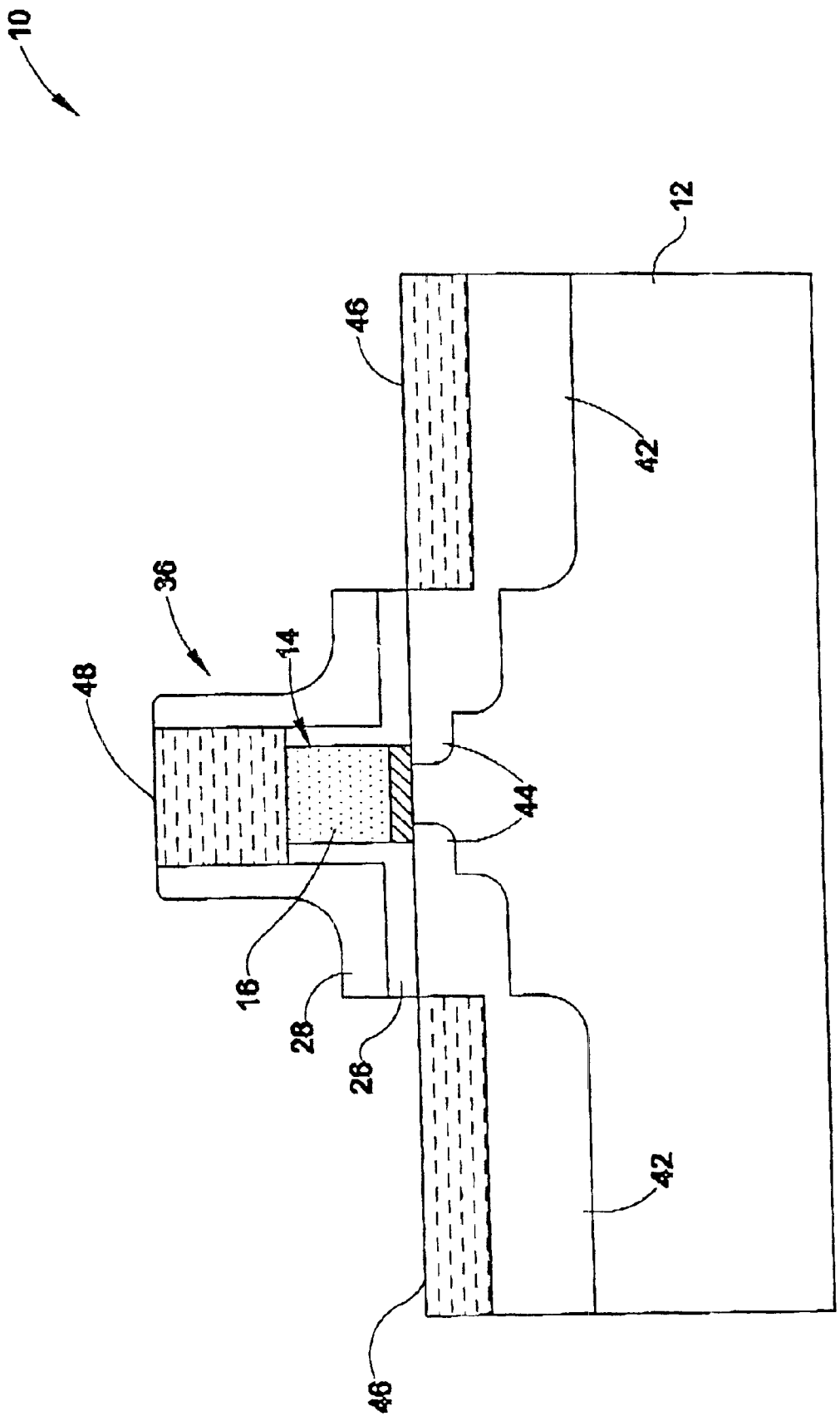
FIG. 7 is a schematic view of the MOSFET of FIG. 6, shown after silicide formation.

Pursuant to deep implantation, solid-phase epitaxy is performed within a surface annealing process performed at low temperature in which the amorphous silicon (a-Si) is recrystallized and the implanted dopants are electrically activated. The low temperature anneal is preferably performed at temperatures of between approximately five hundred degrees Celsius and six hundred degrees Celsius (500° C.–600° C.). The junction contour is defined by the asimplanted boundary of the amorphous silicon (a-Si) layer. The junction extension 44 after annealing is preferably in the approximate range of from thirty nanometers to forty nanometers (30 nm–40 nm) in depth, while the source-drain extension after annealing is approximately sixty nanometers to one hundred nanometers (60 nm–100 nm) in depth. Referring now to FIG. 7, source and drain silicide 46 along with gate silicide 48 have been formed. It will be appreciated that by creating a pocket stepped junction, the silicide for the source and drain contacts may be formed to a depth that exceeds the depth of the implanted junction beneath the gate electrode. It will be further appreciated that gate silicide 48 is formed in a width that exceeds that of gate electrode 16 by an amount which is equivalent to twice the thickness of the deposited first spacer 26. Additionally, the L-shaped spacer is retained to narrowly separate the contact areas and thereby boost circuit density. Contact formation, and the remainder of the fabrication steps for MOSFET 10, may be performed conventionally.

Accordingly, it will be seen that this invention provides for engineering of the junction contour with a single deep implantation step when fabricating a short channel width MOSFET transistor. The contoured junction reduces adverse short-channel effects while providing for an increased depth of source and drain silicide. It will be appreciated that the specification describes an embodiment of the process for a specific transistor geometry and structure; whereas the inventive method may be generally practiced for transistors of various configurations, processing practices, and processing geometries (e.g. layout rules and spacing).

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of controlling junction contour within a MOSFET device, comprising:

forming insulating material into a contoured L-shaped spacer adjacent a gate stack; and implanting a source-drain junction through the contoured L-shaped spacer to create a stepped junction contour and extended source-drain channel wherein the contoured L-shaped spacer is formed from an L-shaped spacer which is contoured to include reduced-height cutouts proximal the gate stack to control implantation profiling.

2. A method as recited in claim 1, wherein forming the contoured L-shaped spacer comprises depositing layers of insulation followed by selective etching thereof.

3. A method as recited in claim 2, wherein the deposited layers comprise a first layer and a second layer of insulating material.

4. A method as recited in claim 3, wherein selective etching of the first layer and second layer is controlled by first forming a third spacer adjacent the gate stack to prevent portions of the first and second layer, adjacent the gate stack, from being etched.

5. A method as recited in claim 3, wherein the first layer of insulating material comprises a liner oxide material.

6. A method as recited in claim 3, wherein the second layer of insulating material comprises a nitride material.

7. A method of fabricating a MOSFET device with a controlled junction profile and a gate stack having a base and a top on a silicon substrate, comprising:

shallow amorphization implanting within the substrate after formation of the gate stack;

depositing a first spacer layer and a second spacer layer;

forming a third spacer at the base of the gate stacks;

removing portions of the first and the second spacer which are not covered by the third spacer to form said first spacer and said second spacer into L-shaped first and second spacers;

removing the third spacer and a portion of the first spacer positioned adjacent the gate stack;

deep amorphization implanting of dopants through said first and second L-shaped spacers, in such a manner that: the depth of implantation is responsive to the geometry of said first and second L-shaped spacers;

surface annealing to recrystallize the silicon substrate and to activate the dopants to form source and drain regions in said silicon substrate; and forming silicide on the source, drain, and gate regions, whereupon conventional fabrication steps may be utilized to provide electrical connections and complete MOSFET device fabrication.

8. A method as recited in claim 7, wherein the first spacer layer is deposited to a depth of between 100 Angstroms to 200 Angstroms.

9. A method as recited in claim 7, wherein the second spacer layer is deposited to a depth of between 250 Angstroms to 400 Angstroms.

10. A method as recited in claim 7, wherein the third spacer comprises an oxide material.

11. A method as recited in claim 7, wherein forming of the third spacer comprises depositing an insulating material followed by selective etching to remove portions of the third spacer not adjacent the gate stack.

12. A method as recited in claim 11, wherein the material of the third spacer is deposited to a depth of between 500 Angstroms and 1000 Angstroms.

13. A method as recited in claim 11, wherein the selective etching of the third spacer is performed comprising a time-controlled wet etching process.

14. A method as recited in claim 7, wherein deep amorphization implanting is performed to create a depth at the junction of between 30 nanometers to 40 nanometers and under the source-drain regions of between 60 nanometers to 100 nanometers.

15. A method as recited in claim 7, wherein surface annealing is performed at a temperature range of from 500° C. to 600° C.

16. A method as recited in claim 7, wherein silicide is formed to a depth which exceeds the junction depth implanted beneath the gate electrode.

* * * * *